(12) United States Patent
Jain et al.

(10) Patent No.: US 10,438,825 B2
(45) Date of Patent: Oct. 8, 2019

(54) SPECTRAL REFLECTOMETRY FOR IN-SITU PROCESS MONITORING AND CONTROL

(71) Applicant: KLA-Tencor Corporation, Milpitas, CA (US)

(72) Inventors: Prateek Jain, San Jose, CA (US); Daniel Wack, Fredericksburg, VA (US); Kevin A. Peterlinz, Fremont, CA (US); Andrei V. Shchegrov, Campbell, CA (US); Shankar Krishnan, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/688,751

(22) Filed: Aug. 28, 2017

(65) Prior Publication Data

US 2018/0061691 A1    Mar. 1, 2018

Related U.S. Application Data

(60) Provisional application No. 62/380,748, filed on Aug. 29, 2016.

(51) Int. Cl.
*H01L 21/67* (2006.01)
*H01L 21/66* (2006.01)

(52) U.S. Cl.
CPC ........ *H01L 21/67253* (2013.01); *H01L 22/10* (2013.01); *H01L 22/12* (2013.01)

(58) Field of Classification Search
CPC .................... H01L 22/67253; H01L 22/10
See application file for complete search history.

(56) References Cited

U.S. PATENT DOCUMENTS 5,608,526 A    3/1997    Piwonka-Corle et al.
5,859,424 A    1/1999    Norton et al.
(Continued)

FOREIGN PATENT DOCUMENTS

JP    2013-040813 A    2/2013

OTHER PUBLICATIONS

International Search Report dated Nov. 20, 2017, for PCT Application No. PCT/US2017/049138 filed on Aug. 29, 2017 by KLA-Tencor Corporation, 5 pages.

*Primary Examiner* — Dominic J Bologna
(74) *Attorney, Agent, or Firm* — Spano Law Group; Joseph S. Spano

(57) ABSTRACT

Methods and systems for performing in-situ, selective spectral reflectometry (SSR) measurements of semiconductor structures disposed on a wafer are presented herein. Illumination light reflected from a wafer surface is spatially imaged. Signals from selected regions of the image are collected and spectrally analyzed, while other portions of the image are discarded. In some embodiments, a SSR includes a dynamic mirror array (DMA) disposed in the optical path at or near a field plane conjugate to the surface of the semiconductor wafer under measurement. The DMA selectively blocks the undesired portion of wafer image. In other embodiments, a SSR includes a hyperspectral imaging system including a plurality of spectrometers each configured to collect light from a spatially distinct area of a field image conjugate to the wafer surface. Selected spectral signals associated with desired regions of the wafer image are selected for analysis.

20 Claims, 8 Drawing Sheets

(56) References Cited

U.S. PATENT DOCUMENTS

| | | | |
|---|---|---|---|
| 5,877,859 A | 3/1999 | Aspnes et al. | |
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 6,985,618 B2 | 1/2006 | Adel et al. | |
| 7,248,375 B2 | 7/2007 | Opsal et al. | |
| 7,352,453 B2 | 4/2008 | Mieher et al. | |
| 7,463,369 B2 | 12/2008 | Wack et al. | |
| 7,478,019 B2 | 1/2009 | Zangooie et al. | |
| 7,502,101 B2 | 3/2009 | Raymond et al. | |
| 7,654,715 B1 * | 2/2010 | Chen | G01N 21/8806 359/368 |
| 7,715,019 B2 | 5/2010 | Kiers et al. | |
| 7,719,677 B2 | 5/2010 | Rosengaus | |
| 7,734,437 B2 | 6/2010 | Tian et al. | |
| 7,826,071 B2 | 11/2010 | Shchegrov et al. | |
| 7,929,667 B1 | 4/2011 | Zhuang et al. | |
| 7,933,026 B2 | 4/2011 | Opsal et al. | |
| 8,030,631 B2 | 10/2011 | Norton et al. | |
| 8,248,617 B2 | 8/2012 | De Groot et al. | |
| 8,441,639 B2 | 5/2013 | Kandel et al. | |
| 8,570,531 B2 | 10/2013 | Li | |
| 8,699,027 B2 | 4/2014 | Wolf et al. | |
| 2004/0075836 A1 * | 4/2004 | Horie | G01B 11/168 356/369 |
| 2004/0235205 A1 * | 11/2004 | Levy | G01N 21/211 438/14 |
| 2008/0121804 A1 * | 5/2008 | Nakasuji | G01N 23/225 250/310 |
| 2011/0043791 A1 | 2/2011 | Smilde et al. | |
| 2011/0141462 A1 | 6/2011 | Reinhorn et al. | |
| 2011/0229830 A1 | 9/2011 | Bhattacharyya et al. | |
| 2011/0310388 A1 | 12/2011 | Hill et al. | |
| 2012/0120396 A1 | 5/2012 | Kandel et al. | |
| 2013/0042089 A1 | 2/2013 | Vihn et al. | |
| 2013/0114085 A1 | 5/2013 | Wang et al. | |
| 2013/0141730 A1 | 6/2013 | Quintanilha | |
| 2013/0215404 A1 | 8/2013 | Den Boef | |
| 2013/0229661 A1 | 9/2013 | Kandel et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2014/0375987 A1 * | 12/2014 | Brunner | G01N 21/8806 356/237.5 |
| 2015/0042984 A1 | 2/2015 | Pandev et al. | |
| 2015/0046118 A1 | 2/2015 | Pandev et al. | |
| 2015/0204664 A1 | 7/2015 | Bringoltz et al. | |
| 2016/0109375 A1 | 4/2016 | Pandev et al. | |
| 2016/0161245 A1 | 6/2016 | Fu et al. | |

* cited by examiner

SPECTRAL REFLECTOMETRY FOR IN-SITU PROCESS MONITORING AND CONTROL

CROSS REFERENCE TO RELATED APPLICATION

The present application for patent claims priority under 35 U.S.C. § 119 from U.S. provisional patent application Ser. No. 62/380,748, entitled "Spectral Reflectometer Configurations for In-Situ Monitoring and Control of the Fabrication Process," filed Aug. 29, 2016, the subject matter of which is incorporated herein by reference in its entirety.

TECHNICAL FIELD

The described embodiments relate to metrology systems and methods, and more particularly to methods and systems for improved measurement of semiconductor structures undergoing a fabrication process step.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

In most examples, precise monitoring of a semiconductor manufacturing process is performed by one or more stand-alone metrology tools. However, in some examples, the metrology tool is integrated with the process tool performing the fabrication step under measurement. This is commonly referred to as in-situ monitoring.

In one example, structures subject to a reactive ion etch process are monitored in-situ. In some fabrication steps, the etch process is required to etch completely through an exposed layer and then terminate before substantial etching of a lower layer occurs. Typically, these process steps are controlled by monitoring the spectral signature of the plasma present in the chamber using an emission spectroscopy technique. When the exposed layer is etched through and the etch process begins to react with a lower layer, a distinct change in the spectral signature of the plasma occurs. The change in spectral signature is measured by the emission spectroscopy technique, and the etch process is halted based on the measured change is spectral signature.

In other fabrication steps, the etch process is required to etch partially through an exposed layer to a specified etch depth, and terminate before etching completely through the exposed layer. This type of etch process is commonly referred to as a "blind etch". Currently, the measurement of etch depth through partially etched layers is based on near-normal incidence spectral reflectometry.

In some examples, the wafer under measurement includes periodic patterns. These patterns exhibit unique reflectivity signatures that can be modeled. Thus, model based spectral reflectometry measurement techniques are suitable for estimating critical dimensions of patterned wafers. Unfortunately, currently available in-situ monitoring tools based on spectral reflectometry lack the precision required to meet future fabrication process requirements.

In many practical examples, the semiconductor wafer under measurement includes homogeneous regions of periodic patterns and also non-homogeneous regions including support circuitry, scribe lines, etc. For example, on a memory wafer, the typical size of the homogeneous region is about 50 microns square surrounded by a non-homogeneous region of a few microns surrounding the homogeneous region. Currently available in-situ monitoring tools illuminate the wafer with a collimated beam that illuminates a large circular area of the wafer, including homogeneous and non-homogeneous regions. Typical illumination spot sizes are ten millimeters in diameter, or larger. The reflected light collected over this large area is mixed and analyzed by a spectrometer. Mixing the reflectivity signals from homogeneous and non-homogeneous regions on the wafer fundamentally limits the performance of the metrology system (i.e., measurement accuracy is limited).

The problem of mixing of reflectivity signals from homogeneous and non-homogeneous regions of the wafer is difficult to solve optically because it is not possible to place illumination and collection optics near the wafer within the reactive plasma chamber. This limits the maximum achievable numerical aperture (NA) and the minimum achievable illumination spot size. Without the ability to optically focus on a small homogeneous region of the wafer with minimum spill-over onto the surrounding non-homogeneous region, it does not appear possible to overcome the limits to measurement accuracy due to mixing of reflected signals.

In summary, ongoing reductions in feature size impose difficult requirements on in-situ spectral reflectometry systems integrated with etch and ion implant process tools. Optical metrology systems must meet high precision and accuracy requirements to enable adequate process control. In this context, the mixing of reflectometry signals from different regions of the wafer under measurement has emerged as a critical, performance limiting issue in the design of in-situ spectral reflectometry systems employed to control etch and ion implant processes. Thus, improved metrology systems and methods to overcome these limitations are desired.

SUMMARY

Methods and systems for performing in-situ, selective spectral reflectometry measurements of semiconductor structures disposed on a wafer are presented herein. Illumination light reflected from a wafer surface is spatially imaged. Signals from selected regions of the image are collected and spectrally analyzed. Specific regions are selected to improve measurement accuracy by discarding portions of the reflected light associated with regions that are inaccurately modelled, or otherwise distort the measurement of one or more parameters of interest. In this manner, in-situ monitoring enables process control of next generation semiconductor structures based on the discrimination and spectral analysis of reflectivity signals associated with different regions of a wafer under measurement.

In one aspect, a selective spectral reflectometer (SSR) includes a dynamic mirror array (DMA) disposed in an optical path of the SSR at or near a field plane conjugate to the surface of the semiconductor wafer under measurement. The DMA includes a plurality of moveable mirror elements. Control commands communicated to the DMA determine the position of each of the moveable mirror elements. Based on the position of each of the moveable mirror elements, the DMA selectively blocks a portion of light incident onto the active surface of the DMA. A DMA may be located in the illumination optical path, the collection optical path, or both.

In a further aspect, a computing system is configured to subtract background images from collected images to remove the effects of stray light collected from sources other than an illumination source of a SSR.

In further aspect, a SSR is configured to recognize the wafer pattern present in a wafer image and select signals associated with desired portions of the image. In some embodiments, an SSR employs a compressive sensing based imaging technique to reconstruct the wafer image. In some embodiments, a SSR employs a 2-D camera to directly capture an image of the wafer under measurement. A computing system is further configured to select the desired regions of the reconstructed image for spectral analysis. In some embodiments, the selection of the desired regions is based on matching with a reference image of the wafer, where the desired and undesired areas of the reference image are known apriori.

In another aspect, a selective spectral reflectometer (SSR) includes a hyperspectral imaging system located in the collection path of the SSR. The hyperspectral imaging system includes a plurality of spectrometers each configured to collect light from a spatially distinct area of a field image conjugate to the surface of the wafer. Based on an analysis of the measured spectra, a computing system determines a subset of the collected spectral signals associated with desired regions of the measurement spot. In some embodiments, a computing system compares each spectral signal with one or more reference signals to determine whether a spectral signal is associated with a desired region of the wafer under measurement. The spectral signals associated with the desired regions are integrated into a composite spectral reflectometry signal associated with the measured spot.

In another further aspect, a SSR is configured to project illumination light onto the surface of a semiconductor wafer over a line shaped area that is scanned in one dimension over a desired measurement area.

In another further aspect, a SSR is configured to project illumination light onto the surface of a semiconductor wafer over a small area (i.e., point illumination) that is scanned in two dimensions over a desired measurement area.

In another further aspect, a SSR includes a one dimensional, line-shaped array of spectrometers, and one or more optical elements of the SSR are configured to scan the one dimensional array of spectrometers across a two dimensional image of the surface of the semiconductor wafer at a field plane conjugate to the surface of the wafer.

In another further aspect, a SSR is configured to limit diffraction effects introduced by obscurations in the optical path. In some embodiments, diffracted light incident on a DMA is controlled by "turning off" selected pixels. In some other embodiments, diffracted light incident onto a hyperspectral imaging system is controlled by ignoring spectral signal channels associated with pixels of the wafer image contaminated with diffracted light. In some other embodiments, an apodizer element is located in the optical path at a location conjugate to the obscuration. The apodizer element is configured to block the diffracted light induced by the obscuration.

In a further aspect, a SSR system is configured to perform a sequence of reflectivity measurements during the fabrication process (e.g., etch process or ion implantation process) using spectral signals associated with the desired regions of the wafer, while ignoring spectral signals associated with the undesired regions.

In another further aspect, a computing system is further configured to estimate a value of one or more parameters of interest that characterize the structure under measurement based at least in part on the selected spectral signals.

In another further aspect, the estimated values of the parameters of interest are used to provide active feedback to a process tool (e.g., lithography tool, etch tool, deposition tool, etc.).

In another further aspect, more than one SSR system may be implemented on a single wafer fabrication process tool to simultaneously measure structures across the wafer during process.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing in-situ, selective spectral reflectometry measurements of semiconductor structures disposed on a wafer are presented herein. Illumination light reflected from a wafer surface is spatially imaged. Signals from selected regions of the image are collected and spectrally analyzed. Specific regions are selected to improve measurement accuracy by discarding portions of the reflected light associated with regions that are inaccurately modelled, or otherwise distort the measurement of one or more parameters of interest. In this manner, in-situ monitoring enables process control of next generation semiconductor structures based on the discrimination and spectral analysis of reflectivity signals associated with different regions of a wafer under measurement.

In some embodiments, the methods and systems for in-situ spectral reflectometry metrology of semiconductor devices undergoing an etch process as described herein are applied to the measurement of memory structures. These embodiments enable optical critical dimension (CD), film, and composition metrology for periodic and planar structures.

In one aspect, a selective spectral reflectometer (SSR) includes a dynamic mirror array (DMA) disposed in an optical path of the SSR. The DMA includes a plurality of moveable mirror elements. Control commands communicated to the DMA determine the position of each of the moveable mirror elements. Based on the position of each of the moveable mirror elements, the DMA selectively blocks a portion of light incident onto the active surface of the DMA. The DMA is located in the optical path of the SSR at or near a field plane conjugate to the surface of the semiconductor wafer. In some embodiments, a DMA is located in the illumination optical path between the illumination source and the semiconductor wafer. In some embodiments, a DMA is located in the collection optical path between the semiconductor wafer and one or more spectrometers. In some embodiments, a DMA is located in the illumination optical path and another DMA is located in the collection optical path. With a DMA located in the optical path of the SSR at a field plane conjugate to the wafer plane, the mirrors of the DMA are selectively positioned to enable signal measurement from specified portions of the wafer, and not from other portions of the wafer.

Figure 1:
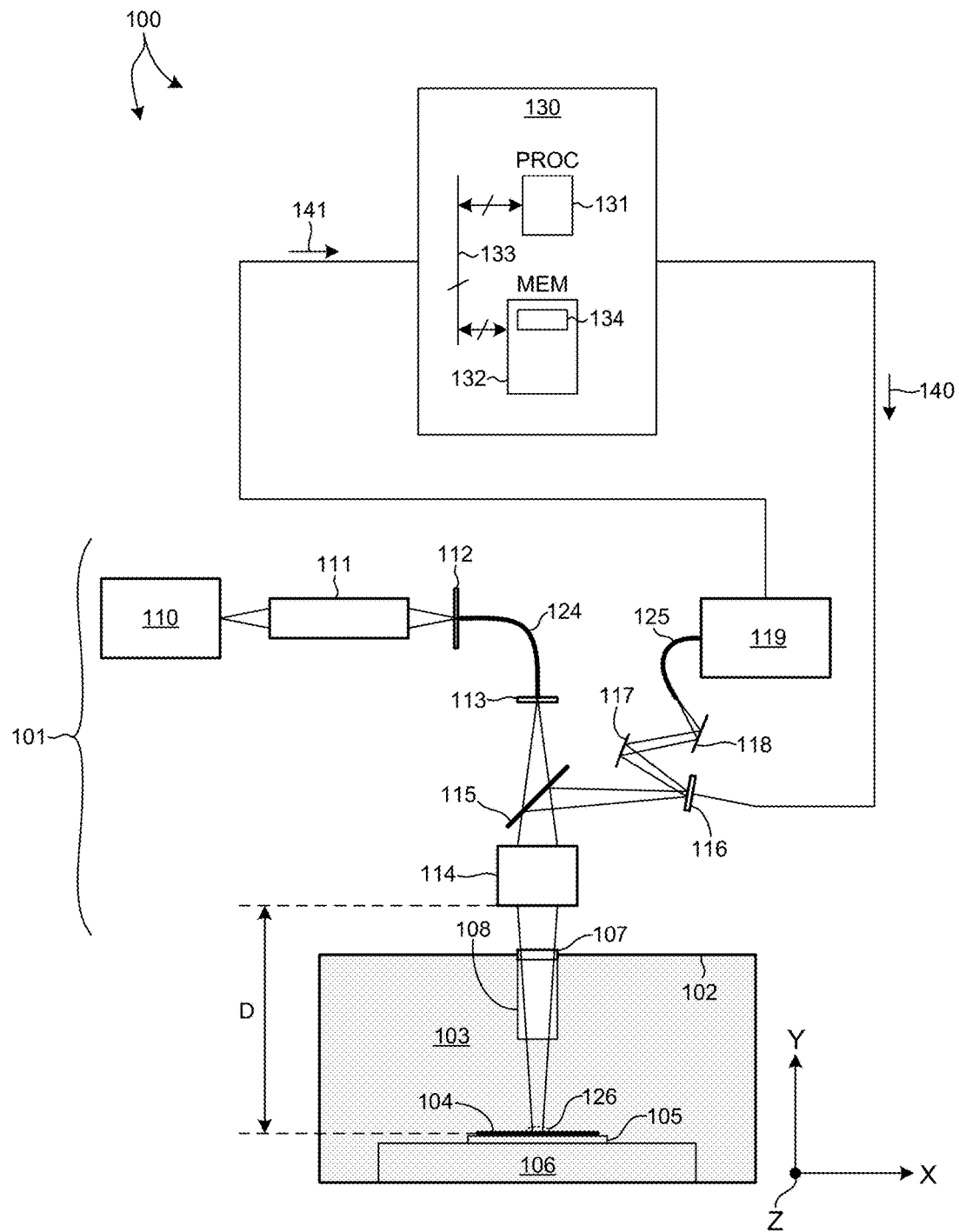
FIG. 1 depicts an embodiment of a wafer processing system 100 for performing in-situ monitoring of an etch process based on selective spectral reflectometry measurements of semiconductor structures disposed on a wafer in at least one novel aspect.

FIG. 1 depicts an exemplary, wafer processing system 100 for performing in-situ monitoring of an etch process based on selective spectral reflectometry measurements of semiconductor structures disposed on a wafer.

Wafer processing system 100 includes a process chamber 102 containing a process environment 103 and a selective spectral reflectometer (SSR) 101. Semiconductor wafer 104 is located within process chamber 102. Wafer 104 is attached to wafer chuck 105 and is positioned with respect to process chamber 102 by wafer stage 106. In some embodiments, wafer stage 106 combines a rotational movement with a translational movement (e.g., a translational movement in the X direction and a rotational movement about the Y-axis) to position wafer 104 with respect to the illumination provided by SSR 101. In some other embodiments, wafer stage 106 combines two orthogonal, translational movements (e.g., movements in the X and Z directions) to position wafer 104 with respect to the illumination provided by SSR 101. In some embodiments, wafer processing system 100 does not include wafer stage 106. In these embodiments, a wafer handling robot (not shown) locates wafer 104 on wafer chuck 105 inside process chamber 102. Wafer 104 is transferred from the wafer handling robot onto an electrostatic wafer chuck 105 that is compatible with a vacuum process environment 103. In these embodiments, the measurements performed by SSR 101 are limited to the portion of wafer 104 within the field of view of SSR 101 after clamping of wafer 104 onto wafer chuck 105. In this sense, wafer stage 106 is optional. To overcome this limitation, wafer processing system 100 may include multiple SSR systems, each measuring a different area of wafer 104.

In one embodiment, process chamber 102 is an element of a reactive ion etch system. In this embodiment, process environment 103 includes a radio frequency induced plasma that etches away exposed material on the surface of wafer 104.

As depicted in FIG. 1, the optical elements of SSR 101 are located outside of the process chamber 102. In some embodiments, all of the optical elements of SSR 101 are located at least a distance, D, from wafer 104. In some of these embodiments, D is at least 300 millimeters. In some other embodiments, D is at least 600 millimeters. Ionized particles are present in the process chamber of both etch and depositions processes. Optical elements must be located sufficiently far away from the wafer to avoid disturbing the magnetic fields induced by the process. In addition, ionized particles may accumulate on optical elements located in the process chamber, and thus it is not practical to include the optical elements in the process chamber.

SSR 101 includes an illumination source 110 that generates a beam of illumination light incident on a measurement spot on the surface of wafer 104. Illumination source 110 is a broadband illumination source. In some embodiments, illumination source 110 emits illumination light in the ultraviolet, visible, and infrared spectra. In one embodiment, illumination source 110 is a laser driven light source (LDLS) (a.k.a., laser driven plasma source or laser sustained plasma light source). The pump laser of the LDLS 110 may be continuous wave or pulsed. A LDLS can produce significantly more photons than a Xenon lamp across the entire wavelength range from 150 nanometers to 2000 nanometers. In general, illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, or any other suitable light source.

In a further aspect, the broadband illumination light provided to wafer 104 is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 3,000 nanometers. In some embodiments, broadband illumination light including wavelengths beyond 3,000 nanometers may be employed.

As depicted in FIG. 1, SSR 101 includes optical elements configured to direct illumination light to, and collect reflected light from, wafer 104. The optical subsystem is shown to include a light pipe 111, a chopper 112, an optical fiber 124, an illumination field stop 113, focusing optics 114, beam splitter 115, relay optics 117 and 118, and optical fiber 125. In some embodiments, SSR 101 includes one or more optical filters (not shown) used to control light level, spectral output, or both, from the illumination source.

As depicted in FIG. 1, light emitted from illumination source 110 is coupled to light pipe 111. In some embodiments, light pipe 111 is a tapered light pipe that effectively functions as an illumination field stop to match the NA of the illumination optics. Light from light pipe 111 passes through chopper 112. Light from a continuous source is chopped by chopper 112 located at or near the focal point at the entrance of illumination fiber 124. In some embodiments, chopper 112 is a resonant piezoelectric driven tuning fork. A resonant tuning fork device is electrically driven and the oscillatory frequency of the tuning force device is easily adjusted to match with process frequencies (e.g., plasma frequency) to ensure that measurements are performed when the process is active. In some other embodiments, a rotary chopper mechanism is employed. In these embodiments, the rotational velocity of the chopper mechanism is adjusted to match with process frequencies.

Chopper 112 is synchronized with the data collection of SSR 101 to alternately allow and block illumination light from reaching wafer 104. During period of time when the illumination light is blocked by chopper 112, background images (e.g., "dark" images) are collected by SSR 101. When the illumination light is not blocked by chopper 112, images of wafer 104 (e.g., "bright" images) are collected by SSR 101.

In a further aspect, a computing system (e.g., computing system 130 or a computing system of spectrometer 119) is configured to subtract background images from "bright" images to remove the effects of stray light collected from sources other than illumination source 110 from the spectral results obtained by spectrometer 119. In one example, plasma emission collected along the optical path is a significant source of background noise present in a "bright" image, and effectively isolated in a "dark" image. In one example, the computing system determines a difference between an amount of collected light at the spectrometer when the optical path is not blocked by the chopper and an amount of collected light at the spectrometer when the optical path is blocked by the chopper. This difference is spectrally analyzed to generate the output signal 141 communicated to computing system 130. In another example, computing system 130 receives spectral signals associated with both "dark" and "bright" images, and determines a spectral difference between the two signals.

In some other embodiments, illumination source 110 is a pulsed light source. In some of these embodiments, the frequency of the pulsed light source is tuned to match process frequencies. In these embodiments, it is not necessary to employ a chopper. In this sense, chopper 112 is optional.

As depicted in FIG. 1, illumination light passes through illumination fiber 124 and through illumination field stop 113 located at or near the focal point at the exit of illumination fiber 124. The illumination source 110 is imaged into illumination fiber 124 to allow for design freedom in the physical layout of the optical system. In some other embodiments, the illumination source is directly coupled to focusing optics 114. Illumination field stop 113 controls the field of view (FOV) of the illumination subsystem and may include any suitable commercially available field stop. Light from illumination source 110 is focused by focusing optics 114 on one or more structures disposed on wafer 104 (e.g., a die) over a measurement spot 126 representative of the field of view of the SSR system. In some embodiments, the measurement spot 126 is circular in shape and approximately three millimeters in diameter. In some embodiments, the measurement spot 126 is circular in shape and less than four millimeters in diameter. In general, the measurement spot 126 may be shaped in any suitable manner.

Illumination and collected light passes one or more window elements 107 gas injector system 108 of process chamber 102. In some embodiments, window element 107 is fabricated from sapphire. However, in general, any suitable optical material may be employed. Gas injector system 108 extends from window element 107 into process chamber 102. In one embodiment, the distance from window element 107 and wafer 104 is approximately 300 millimeters and gas injector system 108 extends approximately 150 millimeters from window elements 107 toward wafer 104. Gas injector system 108 introduces a gas flow along the optical path to prevent ionized gas particles from impacting and contaminating window elements 107. Exemplary gas injector systems are manufactured by LAM Research Corporation, Fremont, Calif. (USA).

Light is reflected from wafer 104 in response to the illumination provided by illumination source 110. The optical subsystem collects the reflected light from the measurement spot 126. Reflected light passes through window elements 107, focusing optics 114, and is directed toward DMA 116 by beam splitting element 115.

As depicted in FIG. 1, SSR 101 includes a DMA 116. The wafer surface under measurement is imaged to an active surface of the DMA and light reflected from selected DMA pixels is coupled into a large core fiber connected to a fiber coupled spectrometer for capture of spectroscopic information.

In some embodiments DMA 116 is a DLP® chip manufactured by Texas Instruments, Inc., Dallas, Tex. (USA). The DLP® chip includes an array of mirror elements selectably positioned in one of two positions. In one position, light is reflected (i.e., directed toward the light source, and in the other position, light is effectively blocked or otherwise removed from the optical path of SSR 101 (i.e., reflected away from the light source). Other DMA implementations may be contemplated, e.g., implementations based on other DMA architectures such as those developed by the Fraunhofer Institute (Germany).

As depicted in FIG. 1, command signals 140 indicative of a desired state of each of the mirror elements of DMA 116 are communicated from computing system 130 to DMA 116. In response, DMA 116 adjusts one or more of the array of mirror elements to achieve the desired state of DMA 116. In some embodiments, the pitch of the array of mirror elements is approximately 10 micrometers. With an optical system designed for 1:1 imaging, DMA 116 has sufficient resolution to select small sized regions on the wafer dominated by patterns to be controlled having small sizes (e.g., regions of interest sized 50 micrometers by 50 micrometers, or even smaller).

In the embodiment depicted in FIG. 1, the selected amount of collected light is directed to collection fiber 125 by relay optics 117 and 119. Collection fiber 125 is coupled to spectrometer 119. Spectrometer 119 generates an output signal 141 responsive to the selected amount of light collected from one or more structures illuminated by the illumination source. In the depicted example, output signal 141 is indicative of a spectral response of the selected amount of light.

In some embodiments (not shown), the optical subsystem includes a collection field stop to control the FOV of the collection subsystem. In some embodiments, a collection field stop is used as a spectrometer slit for the spectrometer 119. However, a collection field stop may be located at or near a spectrometer slit of the spectrometer 119.

In general, the optical subsystem may include any type and arrangement of optical filter(s), field stops, aperture stops, fibers, etc. known in the art of spectroscopic reflectometry. For example, fibers 124 and 124 are optional as light may be directly coupled to spectrometer 119 and focusing optics 114. The use of optical fibers may be advantageous in the design of in-situ SSR systems where space is highly constrained by other process tool hardware.

Figure 5:
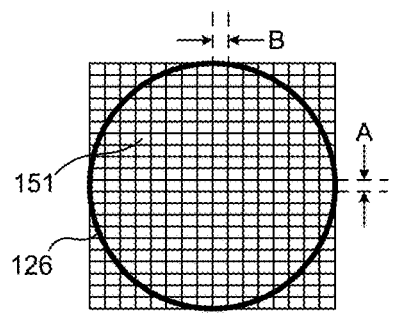
FIG. 5 depicts an illustration of an image of a portion of a wafer illuminated by a circular measurement spot.

FIG. 5 depicts an illustration of an image of a portion of wafer 104 illuminated by a circular measurement spot 126. As depicted in FIG. 5, the area of wafer 104 illuminated by SSR 101 includes many homogeneous structural areas 151 (white blocks) surrounded by non-homogeneous structural areas (black lines). The homogeneous structural areas have dimensions A and B. In one embodiment, dimension A is 40 micrometers and dimension B is 60 micrometers.

Figure 6:
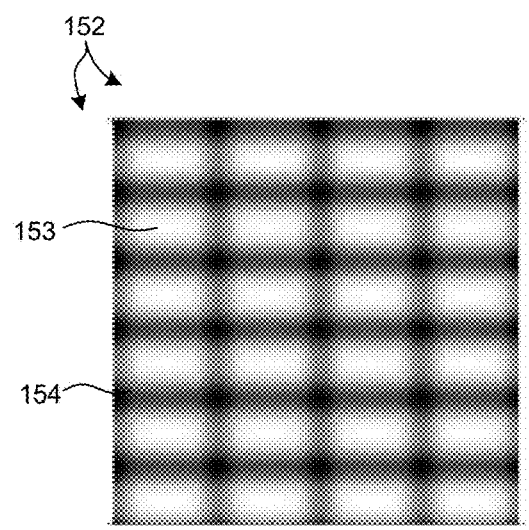
FIG. 6 depicts an illustration of an image of a portion of a wafer measured by a selective spectral reflectometer with all light selected for measurement by a dynamic mirror array.

FIG. 6 depicts an illustration of an image 152 of a portion of wafer 104 measured by SSR 101 with all light selected for measurement by DMA 116. As depicted in FIG. 6, the area of wafer 104 illuminated by SSR 101 includes many homogeneous structural areas 153 (light colored areas) surrounded by non-homogeneous structural areas 154 (black line shaped areas).

Figure 7:
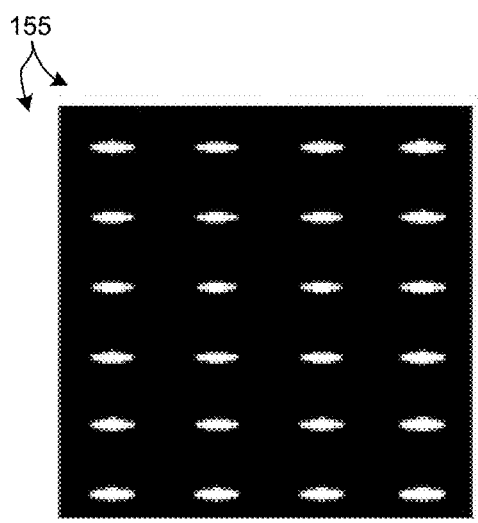
FIG. 7 depicts an illustration of an image of a portion of the wafer depicted in FIG. 6 as measured by a selective spectral reflectometer with only a subset of the available light selected for measurement a dynamic mirror array.

FIG. 7 depicts an illustration of an image 155 of the same portion of wafer 104 measured by SSR 101 with only a subset of the available light selected for measurement by DMA 116. As depicted in FIG. 7, the area of wafer 104 measured by SSR 101 includes only homogeneous structural areas. In this manner, the resulting spectral signal generated by spectrometer 119 based on the light selected by DMA 116 is expected to be a high purity signal (i.e., indicative of spectral results associate with homogeneous structural areas only with very little influence from non-homogeneous structural areas).

Figure 8:
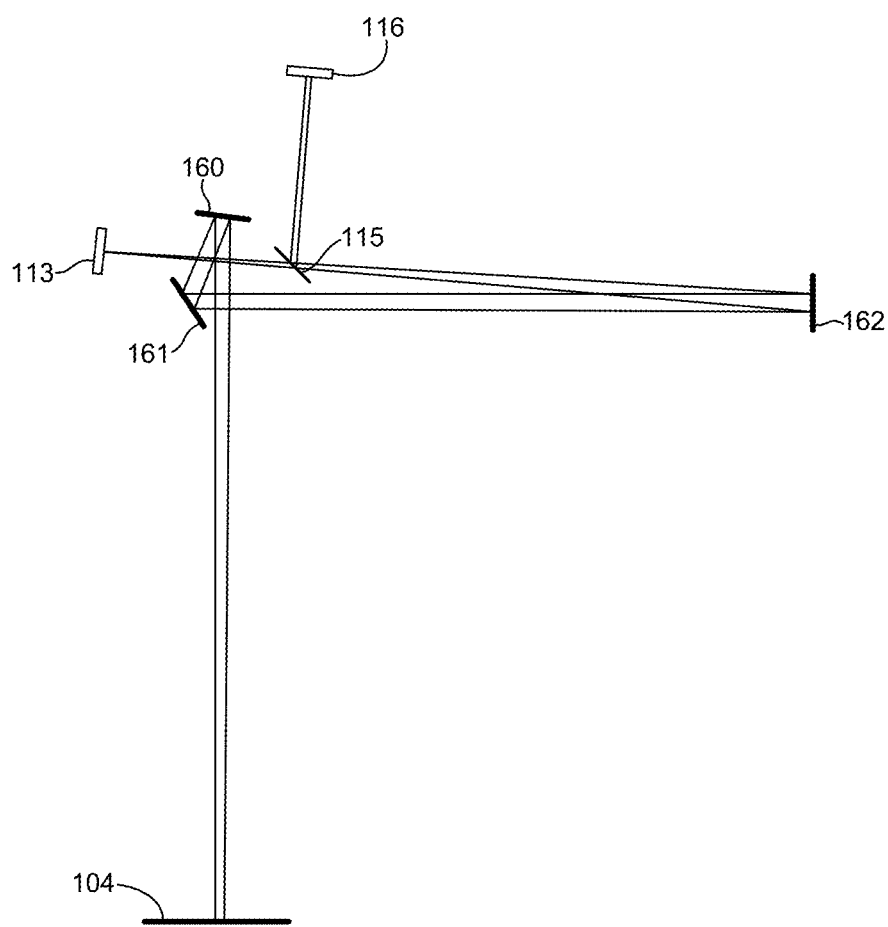
FIG. 8 depicts an illustration of one focusing optics 114 in one embodiment.

FIG. 8 depicts focusing optics 114 in one embodiment. As depicted in FIG. 8, illumination field stop 113 is located at or near a field plane conjugate to the surface of wafer 104. Light passing through illumination field stop 113 reflects from mirror 162. Mirror 162 collimates the illumination light and directs the light to mirror 161. Light reflected from mirror 161 is directed to focusing mirror 160, which focuses the illumination light onto the surface of wafer 104. Light reflected from the surface of wafer 104 is reflected from mirror 160, 161, and 162. Beam splitter 115 picks off a portion of the reflected light and directs the light to DMA 116 located at or near a field plane conjugate to the surface of wafer 104.

The illumination light incident on the surface of wafer 104 is normally incident. At the surface of wafer 104, the optical system is telecentric; the center of the optical beam incident on wafer 104 is normal to the surface of wafer 104. This is achieved by placing mirror 162 at the focal plane of mirror 160. The optical system is almost symmetric between mirror 162 and mirror 160. Mirror 161 functions as a fold mirror to avoid interference with the process chamber 102. In some embodiments, mirrors 160 and 162 have the same prescription and mirror 161 is a flat mirror. In these embodiments, it may be advantageous to prescribe mirrors 160 and 162 as off axis parabola (OAP) optical elements.

Figure 3:
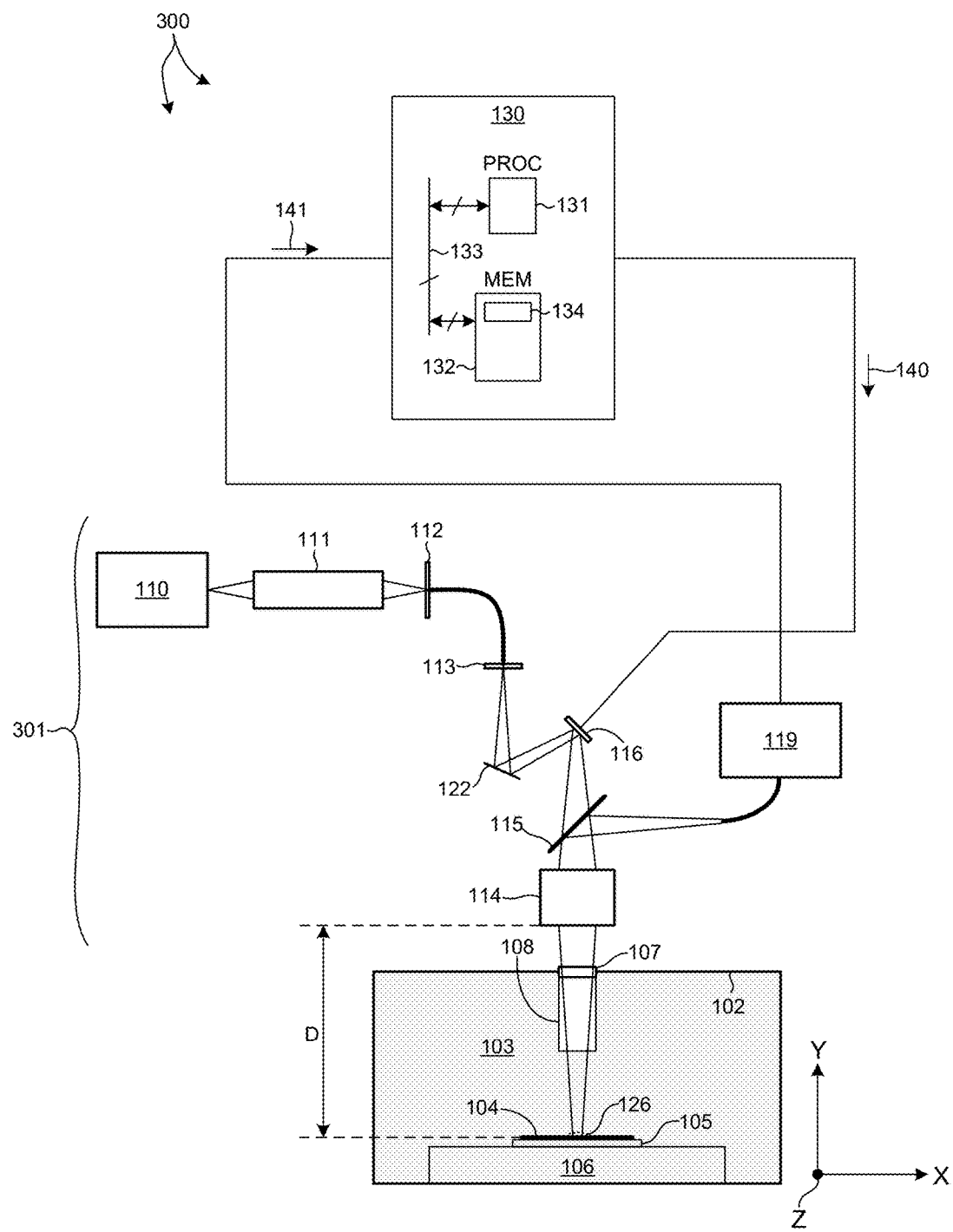
FIG. 3 depicts yet another embodiment of a wafer processing system 100 for performing in-situ monitoring of an etch process based on selective spectral reflectometry measurements of semiconductor structures disposed on a wafer in at least one novel aspect.

FIG. 3 depicts a wafer processing system 300 in another embodiment. Elements shown in FIG. 3 that are similarly configured as metrology system 100 depicted in FIG. 1 have been indicated using the same reference numerals. As depicted in FIG. 3, SSR 301 includes DMA 116 in the illumination beam path, rather than the collection beam path as illustrated in FIG. 1. In this embodiment, relay optics 122 project illumination light onto DMA 116, which is located at or near a field image plane conjugate to surface of wafer 104. Analogous to SSR 101, the array of mirrors of DMA 116 depicted in FIG. 3 is controlled by computing system 130 to selectively illuminate desired regions of wafer 104 within measurement spot 126 and not illuminate undesired regions. In this manner, a spectral signal generated by spectrometer 119 in response to a particular illumination pattern determined by DMA 116 will include signal information associated with desired regions of wafer 104, and not undesired regions.

In general, a SSR may include a DMA located in the illumination path, a DMA located in the collection path, or a DMA located in the illumination path and another DMA located in the collection path.

As described herein, a SSR is configured to select signals from desired regions of a measured image of a semiconductor wafer, and ignore signals from undesired regions of the same image. In further aspect, a SSR is configured to define the desired and undesired regions for selection.

In general, a semiconductor wafer 104 is placed on the wafer chuck 105 with some variation in position and orientation. Thus, in many embodiments, it is not known apriori what area of the semiconductor wafer falls within measurement spot 126, and thus, which portions of measurement spot 126 are desired for analysis and which portions should be ignored. To resolve this issue, an SSR is configured to recognize the wafer pattern present in the image of measurement spot 126, and select signals associated with desired portions of the image.

In some embodiments, an SSR employs a compressive sensing based imaging technique to reconstruct the image of measurement spot 126. From this image, computing system 130 is configured to select desired regions for spectral analysis. In the embodiment depicted in FIG. 1, computing system 130 communicates a sequence of command signals 140 to DMA 116. In response to each command signal, DMA 116 implements a different pattern of mirror positions (i.e., different arrangements of on/off state among the array of mirrors). For each different DMA pattern, spectrometer 119 collects a spectrum, and communicates a sequence of signals 141 to computing system 130, each signal indicative of a spectrum associated with a different DMA pattern. Computing system 130 implements a compressive sensing algorithm to reconstruct an image of measurement spot 126 present at the active surface of DMA 116 based on the measured spectra and the known DMA patterns associated with the measured spectra. In this manner, spectrometer 119 and DMA 116, in combination with computing system 130, is effectively operating as a single pixel camera.

Computing system 130 is further configured to select the desired regions of the reconstructed image for spectral analysis. In some embodiments, the selection of the desired regions is based on matching with a reference image of the wafer, where the desired and undesired areas of the reference image are known apriori. In this manner, the spatial image of the current measured wafer is compared with a map created during training of the measurement recipe. The map is unique to the wafer layout of the currently measured wafer. Furthermore, computing system 130 is configured to communicate a command signal 140 to DMA 116 to turn "on" mirrors associated with the desired regions of the reconstructed image and turn "off" pixels associated with undesired regions.

In some embodiments, a SSR employs a 2-D camera to directly capture an image of the reflected light incident on DMA 116. From this image, computing system 130 is configured to select desired regions for spectral analysis.

Figure 2:
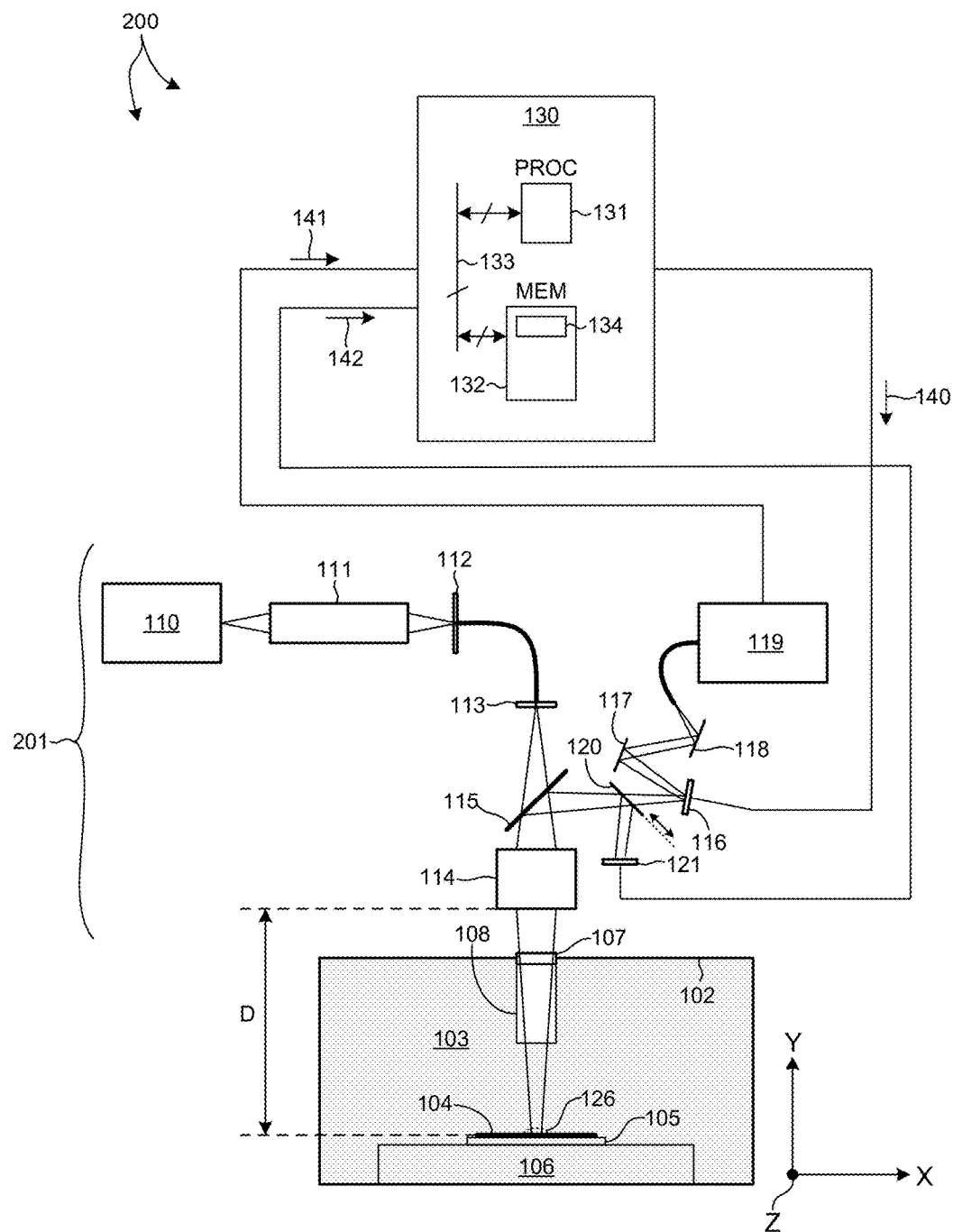
FIG. 2 depicts another embodiment of a wafer processing system 100 for performing in-situ monitoring of an etch process based on selective spectral reflectometry measurements of semiconductor structures disposed on a wafer in at least one novel aspect.

FIG. 2 depicts a wafer processing system 200 in another embodiment. Elements shown in FIG. 2 that are similarly configured as metrology system 100 depicted in FIG. 1 have been indicated using the same reference numerals. As depicted in FIG. 2, SSR 201 includes a camera 121 selectively located in the optical beam path. Camera 121 is located at a field plane conjugate to the surface of wafer 104, and thus captures the same image as the image of wafer 104 projected onto the active area of DMA 116. Camera 121 communicates signals 142 indicative of the measured image to computing system 130. Computing system 130 is further configured to select the desired regions of the captured image for spectral analysis. In some embodiments, the selection of the desired regions is based on matching with a reference image of the wafer where the desired and undesired areas of the reference image are known apriori. Furthermore, computing system 130 is configured to communicate a command signal 140 to DMA 116 to turn "on" mirrors associated with the desired regions of the reconstructed image and turn "off" pixels associated with undesired regions.

A movable mirror 120 includes an actuator controlled by computing system 130 that causes the movable mirror 120 to selectively move into the optical path before DMA 116 and redirect the collected light to the surface of camera 121. After image collection, the moveable mirror 120 is moved outside the optical path allowing the collected light to pass to DMA 116. In this manner, computing system 130 controls the position of moveable mirror 120, and thus the collection of images by camera 121. Moveable mirror 120 is commonly referred to as a "flip-in" mirror. In general, any suitable mechanism may be employed to direct light to camera 121. In some embodiments, a beam splitter may be located in the optical path, rather than a moveable mirror. In these embodiments, light may be simultaneously transmitted to both camera 121 and DMA 116. However, the disadvantage of this approach is the loss of light present at DMA 116 weakens the spectral signals generated by spectrometer 119.

In embodiments employing a DMA, computing system 130 collects images of the measured light, performs pattern matching with reference images, and communicates command signals to one or more DMAs to select desired light for spectral analysis either before etch starts, or during the initial etch time interval.

In another aspect, a selective spectral reflectometer (SSR) includes a hyperspectral imaging system located in the collection path of the SSR. The hyperspectral imaging system includes a plurality of spectrometers each configured to collect light from a spatially distinct area of a field image conjugate to the surface of the wafer. In this manner, each spectrometer performs a spectral analysis of light collected from a spatially distinct area of the measurement spot. Based on an analysis of the measured spectra, computing system 130 determines a subset of the collected spectral signals associated with desired regions of the measurement spot. The spectral signals associated with the desired regions are integrated into a composite spectral reflectometry signal associated with the measured spot.

Figure 4:
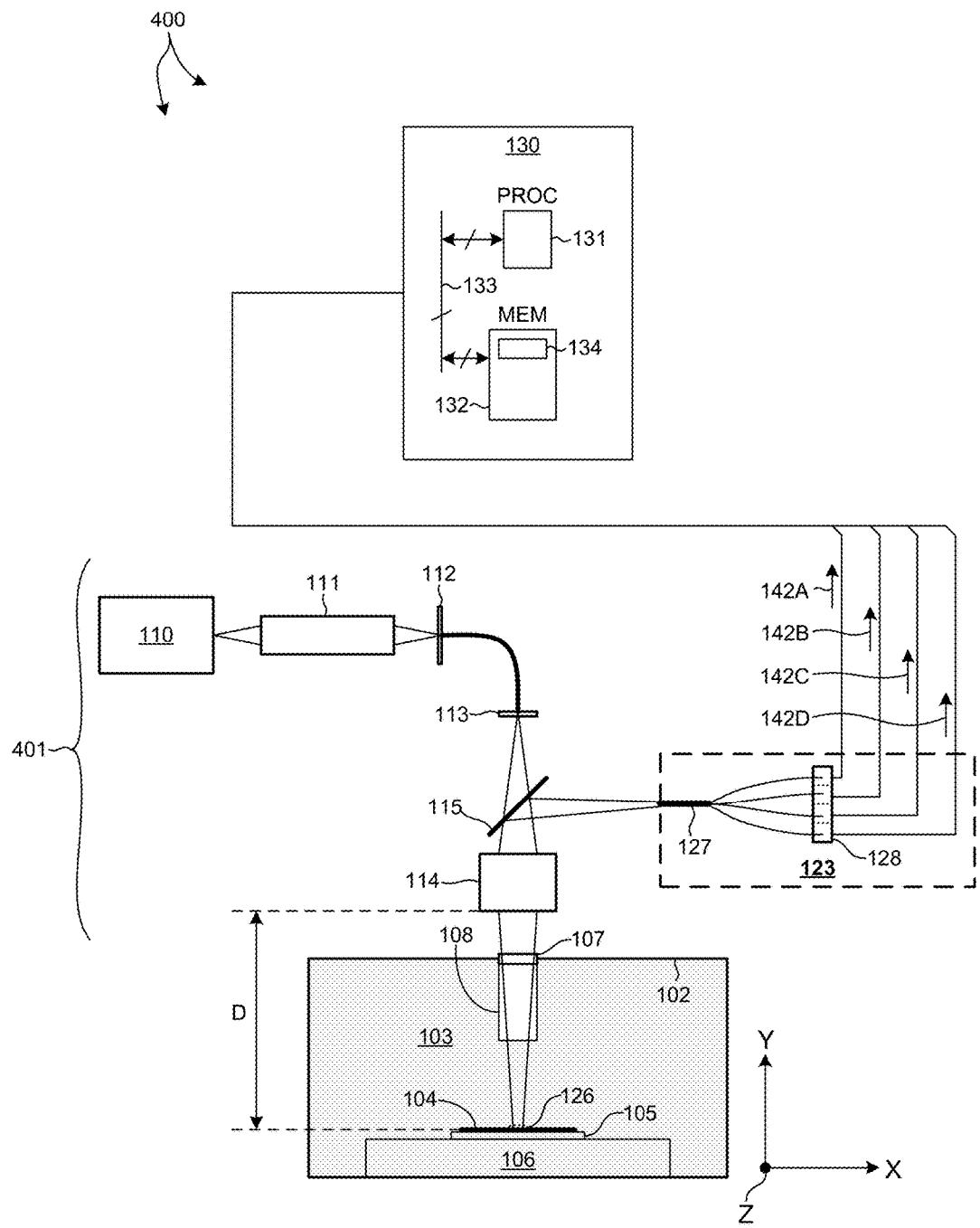
FIG. 4 depicts yet another embodiment of a wafer processing system 100 for performing in-situ monitoring of an etch process based on selective spectral reflectometry measurements of semiconductor structures disposed on a wafer in at least one novel aspect.

FIG. 4 depicts an exemplary, wafer processing system 400 for performing in-situ monitoring of an etch process based on selective spectral reflectometry measurements of semiconductor structures disposed on a wafer. Elements shown in FIG. 4 that are similarly configured as metrology system 100 depicted in FIG. 1 have been indicated using the same reference numerals. As depicted in FIG. 4, SSR 401 includes a hyperspectral imaging system 123 located in the collection beam path.

In the embodiment depicted in FIG. 4, the hyperspectral imaging system 123 includes a fiber array 127 and an array of spectrometers 128. Each fiber of the fiber array 127 and associated spectrometer of the array of spectrometers 128 is a measurement channel of the hyperspectral imaging system 123. The entrance of fiber array 127 is located at or near a field plane conjugate to the surface of wafer 104 under measurement. At the entrance, the fiber array 127 includes a two dimensional arrangement of individual fibers each located to collect light from a spatially distinct area of the field image. In this manner, each fiber collects light associated with a spatially distinct area of the measurement spot 126. Each fiber of the fiber array 127 is optically coupled to a different spectrometer of the array of spectrometers 128. In one embodiment, fiber bundle 127 is flattened into a line of fibers that are aligned along a long slit of a spectrograph. The light collected by each fiber is detected and spectrally analyzed separately by each spectrometer of the array of spectrometers 128. In this manner, each spectrometer performs a spectral analysis of light collected from a spatially distinct area of the measurement spot. Signals (e.g., signals 142A-D) associated with each unique spectrum measured by each measurement channel are communicated from the hyperspectral imaging system 123 to computing system 130.

In further aspect, a SSR employing a hyperspectral imaging system is configured to define the desired and undesired regions for spectral signal selection. As described hereinbefore, it is generally not known apriori what area of the semiconductor wafer falls within measurement spot 126, and thus, which portions of measurement spot 126 are desired for analysis and which portions should be ignored. To resolve this issue, an SSR employing a hyperspectral imaging system is configured to recognize and select spectral signals associated with a desired region of the measured wafer.

In the embodiment depicted in FIG. 4, computing system 130 receives spectral signals 142A-D from hyperspectral imaging system 123. As described hereinbefore, each spectral signal is associated with light collected from a different area of measurement spot 126. Computing system 130 compares each spectral signal with one or more reference signals to determine whether a spectral signal is associated with a desired region of the wafer under measurement. In some embodiments, the reference signals are spectral signals known apriori to be associated with desired regions of the wafer under measurement. For example, a set of reference signals may be defined during measurement recipe development. In some embodiments, computing system 130 determines a difference between a measured spectrum and a reference spectrum. If the difference between the measured and reference spectra does exceeds a predetermined threshold value, the measure spectra is considered to be from an undesired region of the wafer and is discarded for purposes of further analysis. If the difference between the measured and reference spectra does not exceed a predetermined threshold value, the measure spectra is considered to be from a desired region of the wafer. In some embodiments, computing system 130 integrates the measured spectra associated with desired regions of the wafer within the measurement spot to generate a composite spectral signal indicative of the spectral reflectivity of the desired regions of the measured wafer.

Furthermore, computing system 130 is configured to perform a sequence of reflectivity measurements during the fabrication process (e.g., etch process or ion implantation process) using spectral signals associated with the desired regions of the wafer, while ignoring spectral signals associated with the undesired regions.

In another further aspect, a SSR is configured to project illumination light onto the surface of a semiconductor wafer over a line shaped area that is scanned over a desired measurement area.

Figure 10:
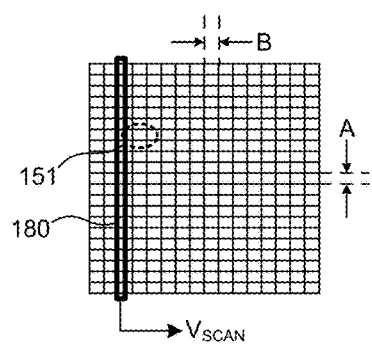
FIG. 10 depicts an illustration of an image of a portion of wafer 104 illuminated by a line shaped illumination area 180.

FIG. 10 depicts an illustration of an image of a portion of wafer 104 illuminated by a line shaped illumination area 180. As depicted in FIG. 10, the optical system of the SSR is configured to scan the line shaped area 180 over a desired measurement area at a velocity, $V_{scan}$.

Figure 9:
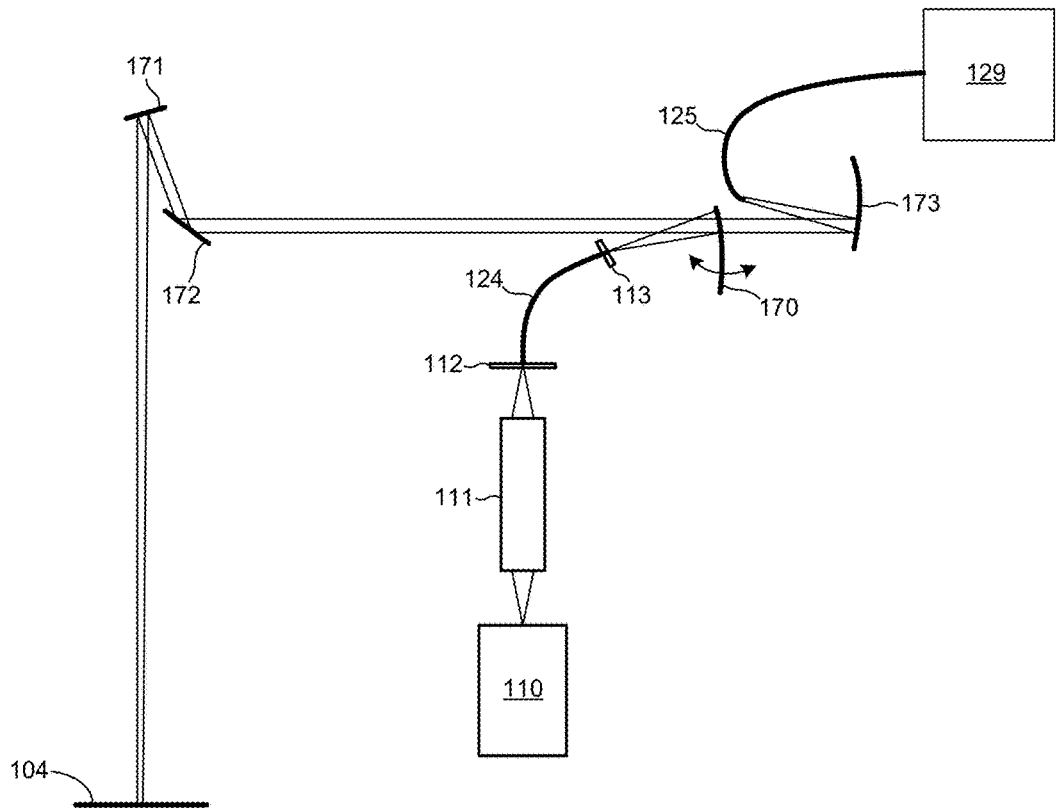
FIG. 9 depicts an illustration of an optical system suitable for implementation of an illumination line scanning SSR system in one embodiment.

FIG. 9 depicts one embodiment of an optical system suitable for implementation of an illumination line scanning SSR system. Elements shown in FIG. 9 that are similarly configured as metrology system 100 depicted in FIG. 1 have been indicated using the same reference numerals. As depicted in FIG. 9, the optical subsystem includes mirrors 170-173. In the depicted embodiment, light pipe 111 is employed to reshape the light generated by the illumination source into a line shape and determine the illumination NA. Illumination field stop 113 is located at the exit of illumination fiber 124 at a field plane conjugate to the surface of wafer 104. Illumination field stop 113 is employed to fine tune the illumination field of view. Illumination light reflects from mirrors 170, 172, and 173. In the depicted embodiment mirror 170 is an off-axis parabola mirror element. Mirror 170 is also a half mirror that acts a beam splitter to transmit the reflected light toward spectrometer 129. The return image is same as the source but the pupil is inverted. On return, the beam passes over mirror 170 to mirror 173, which focuses the return beam into a line slit of spectrometer 129 or a line shaped fiber bundle of spectrometer 129. The half mirror is positioned so that the pupil is cut horizontally. This maintains symmetry and reduces aberrations.

Mirror 170 is an actuated mirror element. In one example, mirror 170 is mounted to a galvanometer based actuation system that rotates mirror 170 such that the line shaped illumination projected onto wafer 104 is scanned across the surface of the wafer in the desired direction at the desired speed. In this embodiment, the actuation system is one dimensional as only one degree of freedom is required to scan the illumination across the surface of the wafer. As depicted in FIG. 9, the long axis of the source slit is aligned perpendicular to the drawing page. Similarly, the rotational axis of the galvanometer is also aligned perpendicular to the drawing page.

The optical system depicted in FIG. 9 is telecentric in wafer space as the stop surface (i.e., mirror 170) is located at the focal plane of curved mirror 171. Mirror 172 is located to fold the optical path as required based on physical constraints introduced by other elements of the wafer processing system. The telecentric design ensures that the return image does not move with scan position. Hence, a stationary spectrometer slit or fiber bundle can be positioned in the return path.

In some embodiments, spectrometer 129 is a spectrograph having pixels resolving along the length of the incoming line shaped return image. The scanning of mirror 170 resolves along the scan direction which is perpendicular to the line shaped return images. In these embodiments, each spectrometer across the spectrometer slit or associated with each fiber of a fiber bundle is spectrally analyzed separately as described hereinbefore with respect to FIG. 4.

In another further aspect, a SSR is configured to project illumination light onto the surface of a semiconductor wafer over a small area (i.e., point illumination) that is scanned in two dimensions over a desired measurement area.

Figure 11:
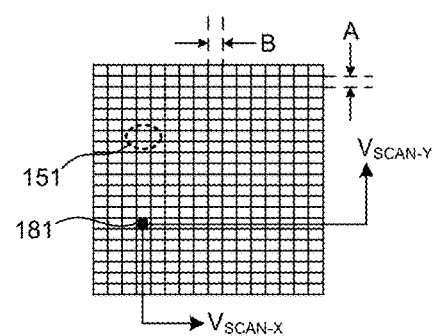
FIG. 11 depicts an illustration of an image of a portion of wafer 104 illuminated by a point shaped illumination area 181.

FIG. 11 depicts an illustration of an image of a portion of wafer 104 illuminated by a point shaped illumination area 181. As depicted in FIG. 11, the optical system of the SSR is configured to scan the line shaped area 181 over a desired measurement area in two dimensions at a velocity, $V_{scan-x}$, in one direction and at a velocity, $V_{scan-y}$, in another direction.

In another embodiment, light pipe 111 depicted in FIG. 9 is employed to reshape the light generated by the illumination source into a small, point shape. Mirror 170 is mounted to a galvanometer based actuation system that rotates mirror 170 about two orthogonal axes such that the point shaped illumination projected onto wafer 104 is scanned across the surface of the wafer in the desired directions at the desired speeds. In this embodiment, the actuation system is two dimensional as two degrees of freedom are required to scan the illumination across the surface of the wafer.

In some embodiments, spectrometer 129 simply spectrally analyzes incoming light sequentially over a spectrometer slit or single fiber. Each spectral signal is associated with a different position on the wafer. Each spectral signal is compared to a reference signal to determine whether the target area associated with each spectral signal should be monitored, or not. In some embodiments, the collected signals over the entire measurement area are individually compared to the reference signal, and the target area associated with the spectral signal that best matches the reference signal is selected for further monitoring during the fabrication process.

In another further aspect, a SSR includes a one dimensional, line-shaped array of spectrometers, and one or more optical elements of the SSR are configured to scan the one dimensional array of spectrometers across a two dimensional image of the surface of the semiconductor wafer at a field plane conjugate to the surface of the wafer. Analogous to line scanning illumination light onto a wafer under measurement, it also contemplated that an optical system may be configured to scan a two dimensional image of light reflected from a measurement spot on the wafer over a line-shaped spectrometer slit, or vice-versa.

In another further aspect, a SSR is configured to limit diffraction effects introduced by obscurations in the optical path. In some embodiments, diffracted light incident on DMA 116 is controlled by "turning off" selected pixels. In some other embodiments, diffracted light incident onto hyperspectral imaging system 123 is controlled by ignoring spectral signal channels associated with pixels of the wafer image contaminated with diffracted light. In some other embodiments, an apodizer element (i.e., an aperture having a complex transmission pattern) is located in the optical path at a location conjugate to the obscuration. The apodizer element is configured to block the diffracted light induced by the obscuration. In one example, the gas flow introduced by gas injector system 108 introduces an obscuration in the optical path that results in significant diffraction. In some embodiments, diffracted light induced by the obscuration of gas injector system 108 is mapped to particular pixels of DMA 116. These pixels are "turned off" to remove the diffracted light from the spectral measurements performed by the SSR system. In some other embodiments, diffracted light induced by the obscuration of gas injector system 108 is mapped to particular channels of a hyperspectral imaging system 123. Light collected from these channels is ignored to remove the diffracted light from the spectral measurements performed by the SSR system. In some other embodiments, an apodizer element (i.e., an aperture having a complex transmission pattern) is located in the optical path at a location conjugate to the gas injector system 108. The apodizer element is configured to block the diffracted light induced by the obscuration of gas injector system 108, and thus remove the diffracted light from the spectral measurements performed by the SSR system.

In a further aspect, computing system 130 is further configured to estimate a value of one or more parameters of interest that characterize the structure under measurement based at least in part on the selected spectral signals. In some embodiments, this occurs while the underlying fabrication process is on-going. For example, during the etch process, continuous monitoring of the composite spectroscopic signal enables better tracking or forecasting of etch rate, depth of trenches, forecasting of desired etch stopping time, etc. Transformation of spectroscopic signals into wafer parameter and etch process parameter estimates may be achieved with a variety of computational methods, including model-based least squares fitting or maximum likelihood estimation, as well as machine learning algorithms trained during recipe creation using single or multiple chamber measurements, and supplemented by synthetic spectra covering larger process windows and wider ranges of system optical variability.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In yet another further aspect, the measurement results described herein can be used to provide active feedback to a process tool (e.g., lithography tool, etch tool, deposition tool, etc.). For example, values of measured parameters determined based on measurement methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to a lithography tool, etch tool, or deposition tool.

In another further aspect, one or more SSR systems may be implemented on a single wafer fabrication process tool to simultaneously measure structures across the wafer during process.

Although in some embodiments, spectral signals associated with non-homogeneous regions are ignored, in some embodiments, it may be desirable to separately monitor spectral signals from both homogeneous regions and non-homogeneous regions. In some embodiments, a composite spectral signal may be generated based on spectral signals from both homogeneous and non-homogeneous regions.

Figure 12:
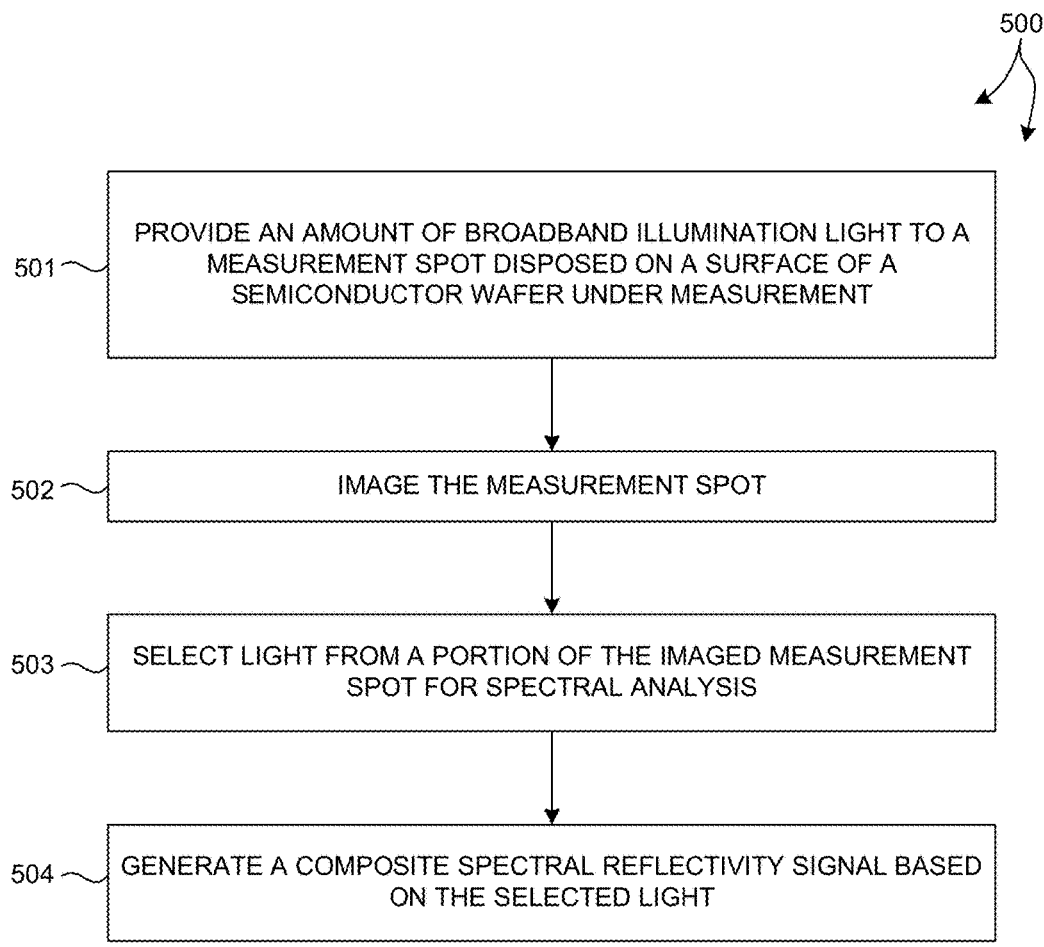
FIG. 12 illustrates a method 500 of performing selective spectral reflectometry measurements in at least one novel aspect.

FIG. 12 illustrates a method 500 of performing SSR measurements in at least one novel aspect. Method 500 is suitable for implementation by a metrology system such as metrology systems 100, 200, 300, and 400 illustrated in FIGS. 1-4 of the present invention, respectively. In one aspect, it is recognized that data processing blocks of method 500 may be carried out via a pre-programmed algorithm executed by one or more processors of computing system 130, or any other general purpose computing system. It is recognized herein that the particular structural aspects of metrology systems 100, 200, 300, and 400 do not represent limitations and should be interpreted as illustrative only.

In block 501, an amount of broadband illumination light is provided to a measurement spot disposed on a surface of a semiconductor wafer under measurement.

In block 502, the measurement spot is imaged.

In block 503, light is selected from a portion of the imaged measurement spot for spectral analysis.

In block 504, a composite spectral reflectivity signal is generated based on the selected light.

In a further embodiment, systems 100, 200, 300, and 400 include one or more computing systems 130 employed to perform measurements of semiconductor structures based on spectroscopic measurement data collected in accordance with the methods described herein. The one or more computing systems 130 may be communicatively coupled to one or more spectrometers, dynamic mirror arrays, active optical elements, etc. In one aspect, the one or more computing systems 130 are configured to receive measurement data associated with spectral measurements of structures of wafer 104.

It should be recognized that one or more steps described throughout the present disclosure may be carried out by a single computer system 130 or, alternatively, a multiple computer system 130. Moreover, different subsystems of systems 100, 200, 300, and 400, may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of the metrology systems 100, 200, 300, and 400 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of systems 100, 200, 300, and 400.

Computer system 130 of metrology systems 100, 200, 300, and 400 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology systems 100, 200, 300, and 400, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A semiconductor wafer processing system comprising:
   a semiconductor fabrication process chamber comprising a fabrication process environment;
   a semiconductor wafer disposed inside the fabrication process chamber and exposed to the fabrication process environment;
   an in-situ, selective spectral reflectometer comprising:
      an illumination source configured to provide an amount of broadband illumination light;
      an optical subsystem configured to direct the amount of illumination light from the illumination source to a measurement spot on a surface of the semiconductor wafer under measurement and direct an amount of light reflected from the measurement spot on the surface of the semiconductor wafer toward a field plane conjugate to the surface of the semiconductor wafer; and
      an array of spectrometers each configured to collect an amount of reflected light at or near the field plane conjugate to the surface of the semiconductor wafer at a different spatial location across the field plane and detect a spectral response of the semiconductor wafer to the amount of broadband illumination light over a range of wavelengths at each of the different spatial locations.

2. The semiconductor wafer processing system of claim 1, further comprising:
   a computing system configured to select a subset of the plurality of detected spectral responses and generate a spectral signal indicative of a reflectivity of a structure under measurement within the measurement spot based on the subset of detected spectral responses.

3. The semiconductor wafer processing system of claim 2, wherein the computing system is further configured to estimate a value of one or more parameters of interest that characterize the structure under measurement based at least in part on the spectral signal.

4. The semiconductor wafer processing system of claim 2, further comprising:
   a camera located at or near a second field plane conjugate to the surface of the semiconductor wafer, and wherein the selecting of the subset of the detected spectral responses is based on an image of the wafer detected by the camera.

5. The semiconductor wafer processing system of claim 2, wherein the selecting of the subset of the detected spectral responses is based on a difference between each of the detected spectral responses and a reference spectra.

6. The semiconductor wafer processing system of claim 1, further comprising:
   a chopper in an optical path between the illumination source and the measurement spot, the chopper configured to periodically block the optical path between the illumination source and the measurement spot and prevent the amount of illumination light from reaching the measurement spot, wherein the detecting of the spectral response at each different spectral location involves a difference between an amount of collected light when the optical path is not blocked by the chopper and an amount of collected light when the optical path is blocked by the chopper.

7. The semiconductor wafer processing system of claim 1, wherein each of the array of spectrometers includes an optical fiber at or near the field plane conjugate to the surface of the semiconductor wafer, and wherein each optical fiber is configured to transmit an amount of collected light to a detector of each of the array of spectrometers.

8. The semiconductor wafer processing system of claim 1, the optical subsystem comprising:
   one or more optical elements configured to shape the amount of illumination light to a one-dimensional line of illumination light projected onto the measurement spot; and
   one or more moveable optical elements configured to scan the one-dimensional line of illumination light across the measurement spot.

9. The semiconductor wafer processing system of claim 1, wherein the array of spectrometers is a one dimensional array, the optical subsystem comprising:
   one or more optical elements configured to scan an image of the surface of the semiconductor wafer at the conjugate field plane across the one dimensional array of spectrometers.

10. The semiconductor wafer processing system of claim 1, the optical subsystem comprising:
    one or more moveable optical elements configured to scan the amount of illumination light across the measurement spot in two dimensions.

11. A semiconductor wafer processing system comprising:
    a semiconductor fabrication process chamber comprising a fabrication process environment;
    a semiconductor wafer disposed inside the fabrication process chamber and exposed to the fabrication process environment;
    an in-situ, selective spectral reflectometer comprising:
       an illumination source configured to provide an amount of broadband illumination light to a measurement spot on a surface of the semiconductor wafer under measurement;
       one or more spectrometers configured to collect an amount of light reflected from the semiconductor wafer and detect a spectral response of the semiconductor wafer to the amount of broadband illumination light over a range of wavelengths; and
       a dynamic mirror array including a plurality of moveable mirror elements, the dynamic mirror array disposed at or near a field plane conjugate to the surface of the semiconductor wafer in an illumination optical path between the illumination source and the semiconductor wafer or in a collection optical path between the semiconductor wafer and the one or more spectrometers, the dynamic mirror array configured to selectively block a portion of incident light based on a position of each of the plurality of moveable mirror elements.

12. The semiconductor wafer processing system of claim 11, wherein the illumination source, the one or more spectrometers, and the dynamic mirror array are located outside of the process chamber.

13. The semiconductor wafer processing system of claim 11, further comprising:
   a computing system configured to communicate a command signal to the dynamic mirror array that causes the dynamic mirror array to selectively block a first portion of light incident onto the plurality of moveable mirror elements while the one or more spectrometers generate a spectral signal indicative of a reflectivity of a structure under measurement within the measurement spot.

14. The semiconductor wafer processing system of claim 13, wherein the computing system is further configured to estimate a value of one or more parameters of interest that characterize the structure under measurement based at least in part on the measured spectral signal.

15. The semiconductor wafer processing system of claim 11, further comprising:
   a camera located at or near a second field plane conjugate to the surface of the semiconductor wafer, and wherein the selecting of the portion of incident light blocked by dynamic mirror array is based on an image of the wafer detected by the camera.

16. The semiconductor wafer processing system of claim 13, wherein the one or more spectrometers includes an array of spectrometers each configured to collect an amount of reflected light at or near a field plane conjugate to the surface of the semiconductor wafer at a different spatial location across the field plane and detect a spectral response of the semiconductor wafer to the amount of broadband illumination light over a range of wavelengths at each of the different spatial locations, wherein the computing system is further configured to generate an image of the reflected light across the field plane based on a plurality of different subsets of the detected spectral responses each associated with a different pattern of incident light blocked by the dynamic mirror array, and wherein the selecting of the portion of incident light blocked by dynamic mirror array is based on the generated image.

17. The semiconductor wafer processing system of claim 11, further comprising:
   a chopper in an optical path between the illumination source and the measurement spot, the chopper configured to periodically block the optical path between the illumination source and the measurement spot and prevent the amount of illumination light from reaching the measurement spot, wherein the detecting of the spectral response involves a difference between an amount of collected light when the optical path is not blocked by the chopper and an amount of collected light when the optical path is blocked by the chopper.

18. A method comprising:
   providing an amount of broadband illumination light to a measurement spot to a structure disposed on a surface of a semiconductor wafer under measurement;
   imaging the measurement spot at a field plane conjugate to the surface of the semiconductor wafer;
   selecting light from a portion of the imaged measurement spot for spectral analysis, wherein the selecting involves a dynamic mirror array including a plurality of moveable mirror elements, the dynamic mirror array disposed at or near the field plane conjugate to the surface of the semiconductor wafer, the dynamic mirror array configured to selectively block a portion of incident light based on a position of each of the plurality of moveable mirror elements; and
   generating a composite spectral reflectivity signal based on the selected light.

19. The method of claim 18, wherein the selecting of the light involves selectively blocking a portion of illumination light, collected light, or both, at one or more field planes conjugate to the surface of the semiconductor wafer.

20. The method of claim 18, wherein the generating of the composite spectral reflectivity signal involves selecting a subset of a plurality of spectral signals each associated with a different portion of the imaged measurement spot.

* * * * *